US010859869B2

(12) United States Patent
Suzuki

(10) Patent No.: US 10,859,869 B2
(45) Date of Patent: Dec. 8, 2020

(54) DISPLAY DEVICE

(71) Applicant: Japan Display Inc., Minato-ku (JP)

(72) Inventor: Daiichi Suzuki, Tokyo (JP)

(73) Assignee: Japan Display Inc., Minato-ku (JP)

(*) Notice: Subject to any disclaimer, the term of this patent is extended or adjusted under 35 U.S.C. 154(b) by 29 days.

(21) Appl. No.: 15/947,061

(22) Filed: Apr. 6, 2018

(65) Prior Publication Data

US 2018/0341132 A1 Nov. 29, 2018

(30) Foreign Application Priority Data

May 26, 2017 (JP) ................................ 2017-104391

(51) Int. Cl.

*G02F 1/13357* (2006.01)
*G02F 1/1335* (2006.01)
*G02F 1/1333* (2006.01)
*G02F 1/1337* (2006.01)
*H01L 27/12* (2006.01)
*G02F 1/1347* (2006.01)

(52) U.S. Cl.

CPC .......... *G02F 1/1336* (2013.01); *G02F 1/1337* (2013.01); *G02F 1/1347* (2013.01); *G02F 1/133305* (2013.01); *G02F 1/133345* (2013.01); *G02F 1/133512* (2013.01); *G02F 1/133514* (2013.01); *H01L 27/124* (2013.01); *H01L 27/1218* (2013.01); *H01L 27/1248* (2013.01); *G02F 2001/133302* (2013.01); *G02F 2001/133601* (2013.01); *G02F 2001/133742* (2013.01); *G02F 2201/121* (2013.01); *G02F 2201/123* (2013.01)

(58) Field of Classification Search

None
See application file for complete search history.

(56) References Cited

U.S. PATENT DOCUMENTS 5,699,139 A * 12/1997 Aastuen ............ G02F 1/133305 349/156
6,660,387 B2 * 12/2003 Oaku ................ B32B 17/10036 428/413
2002/0176042 A1 * 11/2002 Moon ............... G02F 1/133345 349/123
2006/0132677 A1 * 6/2006 Asao ................. G02F 1/133514 349/106
2007/0200978 A1 8/2007 Ishitani et al.
2009/0147186 A1 * 6/2009 Nakai ................. G02F 1/13471 349/74

(Continued)

FOREIGN PATENT DOCUMENTS

JP 2007-256939 10/2007

*Primary Examiner* — Edward J Glick
*Assistant Examiner* — David Y Chung
(74) *Attorney, Agent, or Firm* — Oblon, McClelland, Maier & Neustadt, L.L.P.

(57) ABSTRACT

In one embodiment, a display device comprises a dimming and display panels and an illumination device. The dimming panel includes first and second substrates and a first liquid crystal layer. The display panel includes third and fourth substrates and a second liquid crystal layer. The illumination device irradiates the dimming panel or the display panel with light. In the display device, at least one of the first, second, third and fourth substrates is a rigid substrate, and at least one of the first, second, third and fourth substrates is a flexible substrate.

9 Claims, 9 Drawing Sheets

1 PL3 PX2 A2 SUB4 LC2 SUB3 PNL2 PL2 PX1 A1 SUB2 LC1 SUB1 PNL1 PL1 PR2 PR1 DF OG RF LD F1 F2 LD LG LU ID Z Y X

(56) References Cited

U.S. PATENT DOCUMENTS

2016/0093255 A1* 3/2016 Aoki .................... G09G 3/3426
345/690
2018/0016499 A1* 1/2018 Wu .................... G02F 1/134309

* cited by examiner

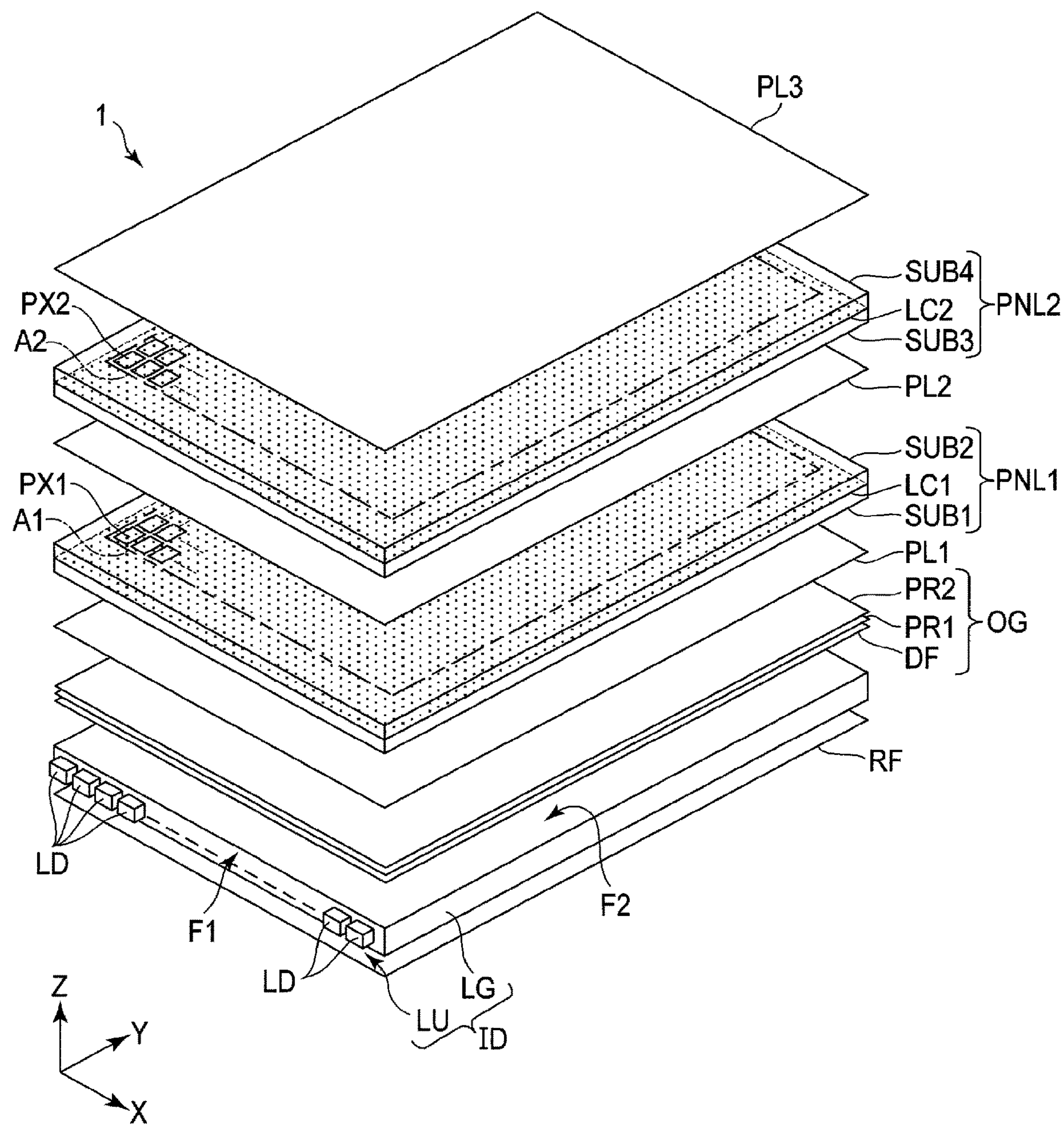
F I G. 1

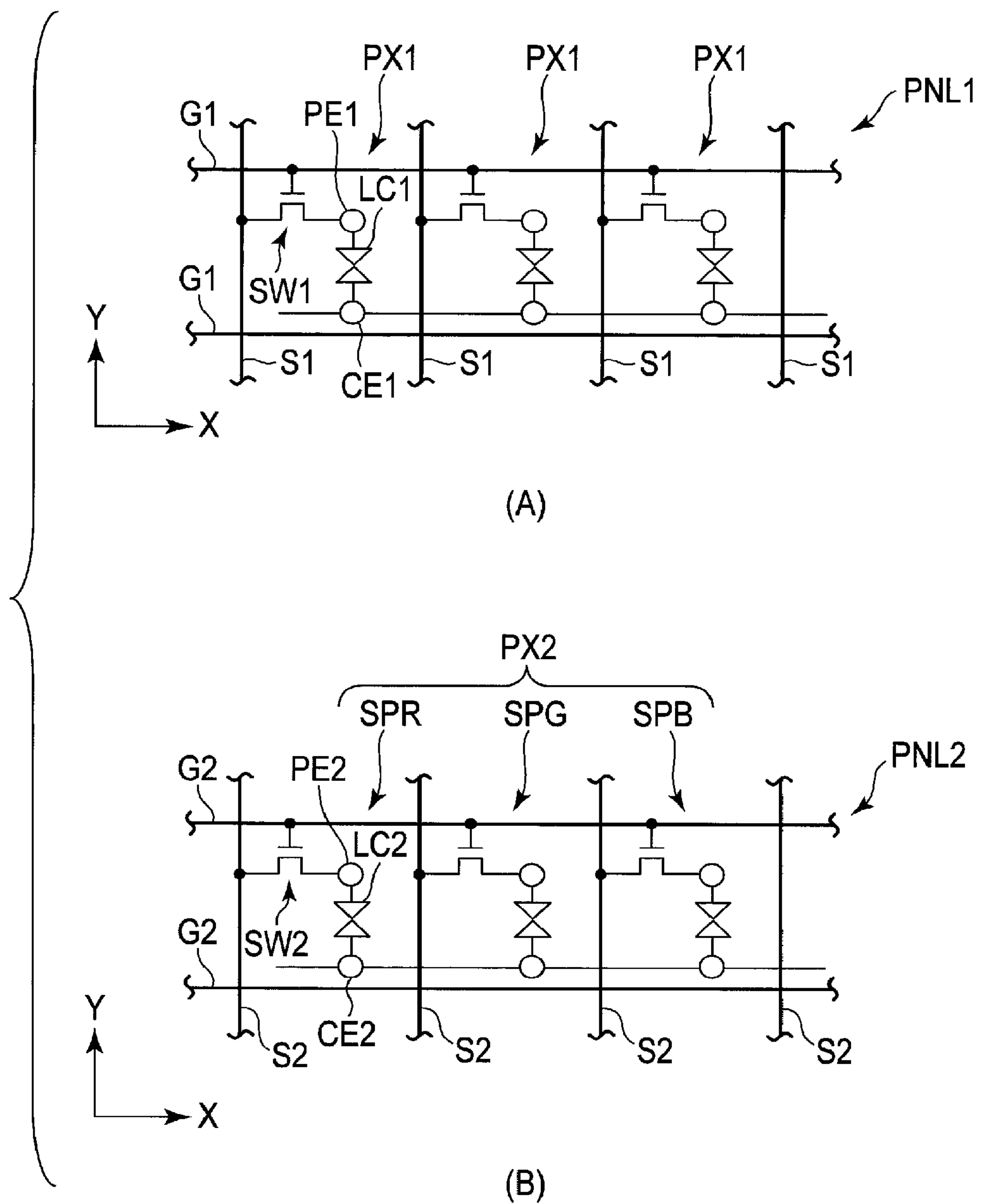
F I G. 2

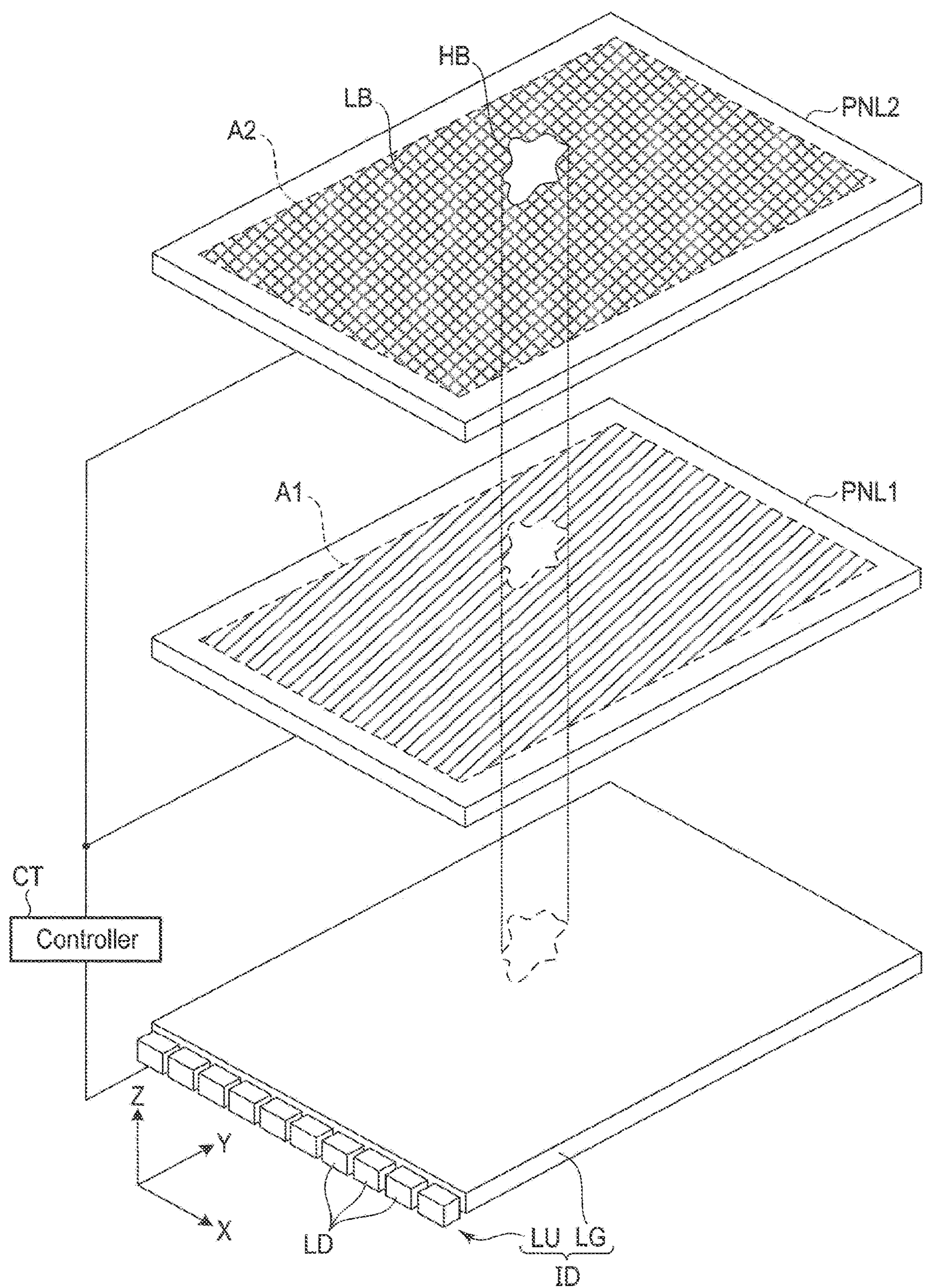
F I G. 3

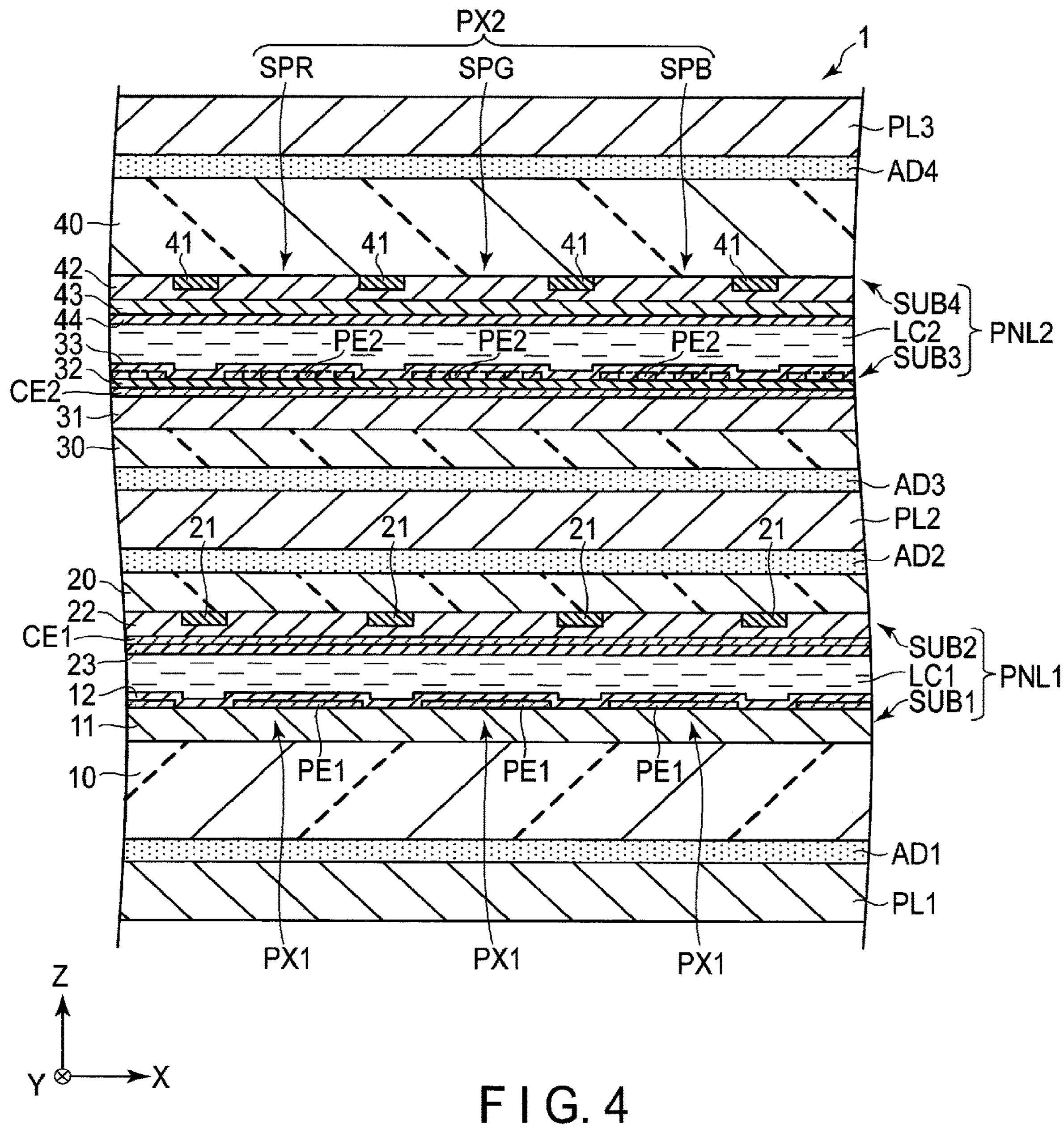
F I G. 4

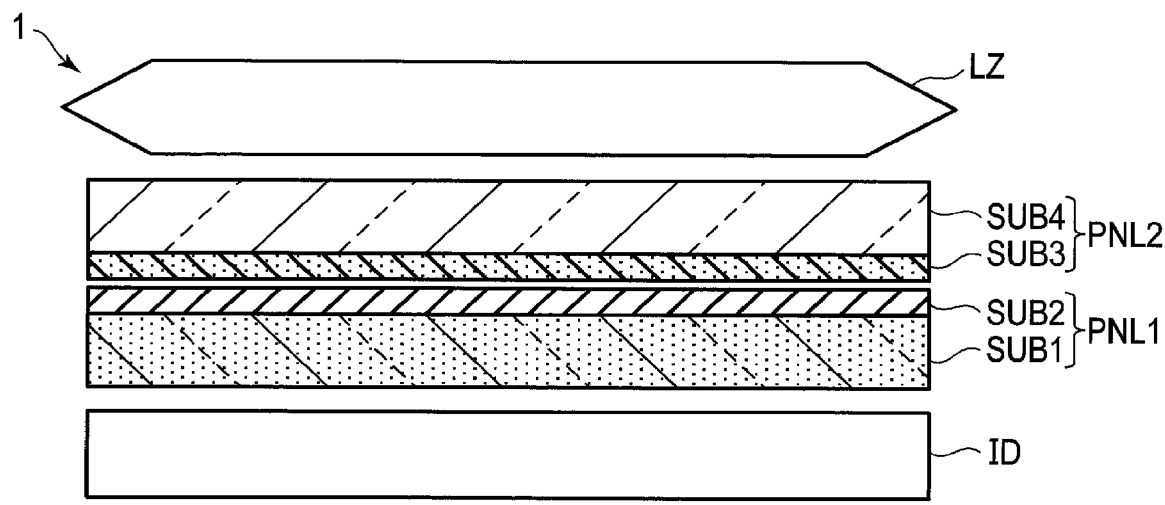
F I G. 5
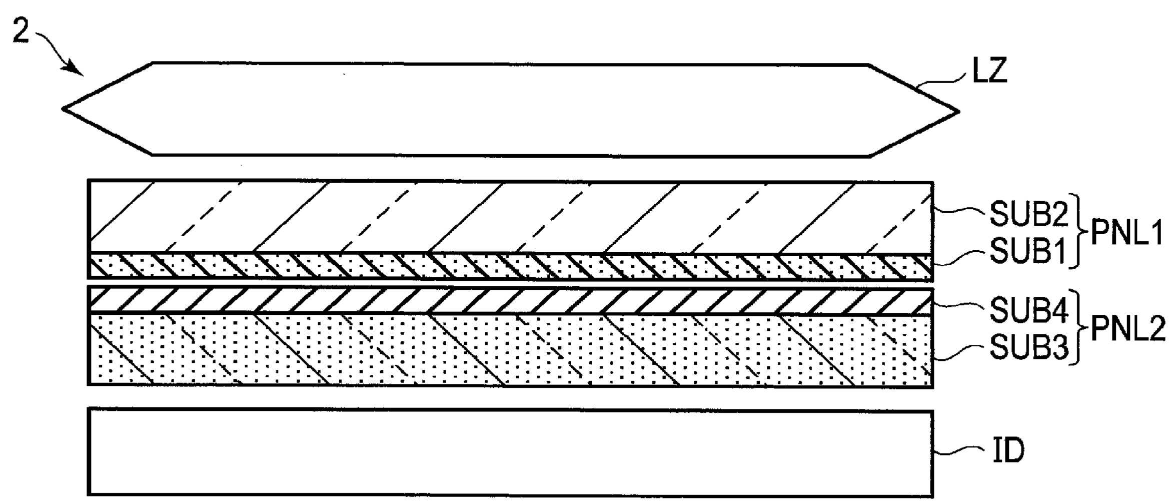
F I G. 6

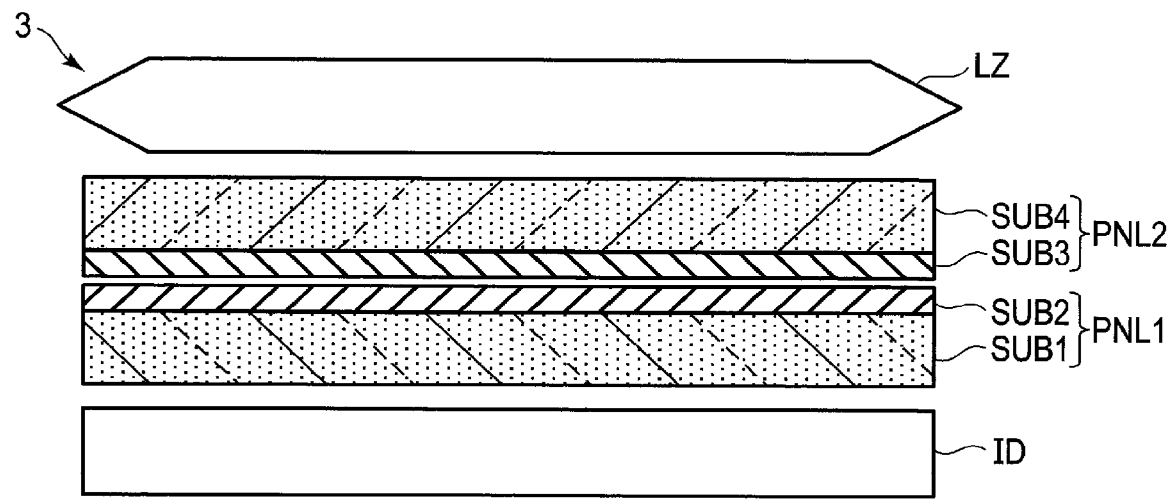
F I G. 7
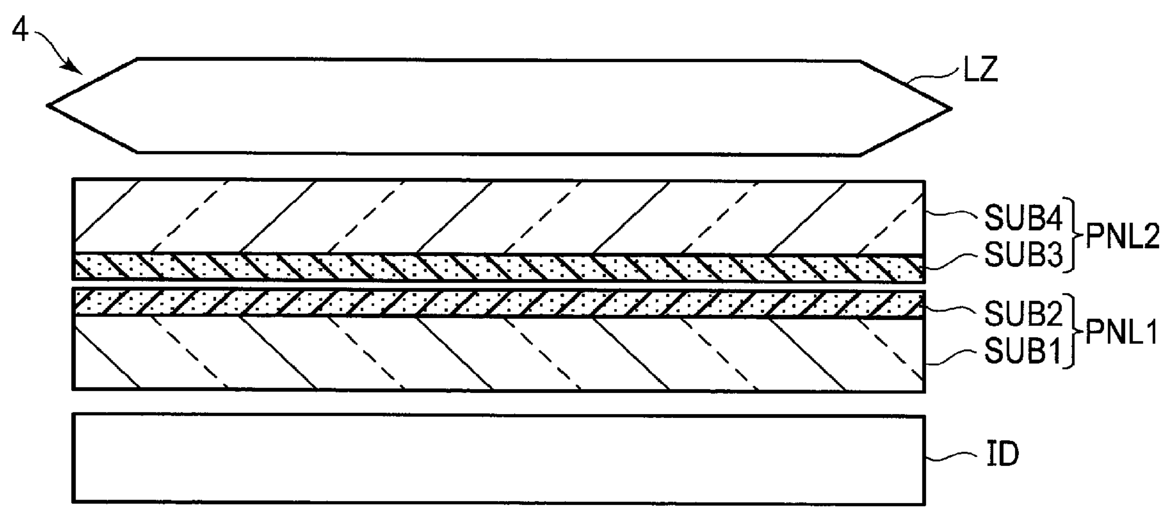
F I G. 8

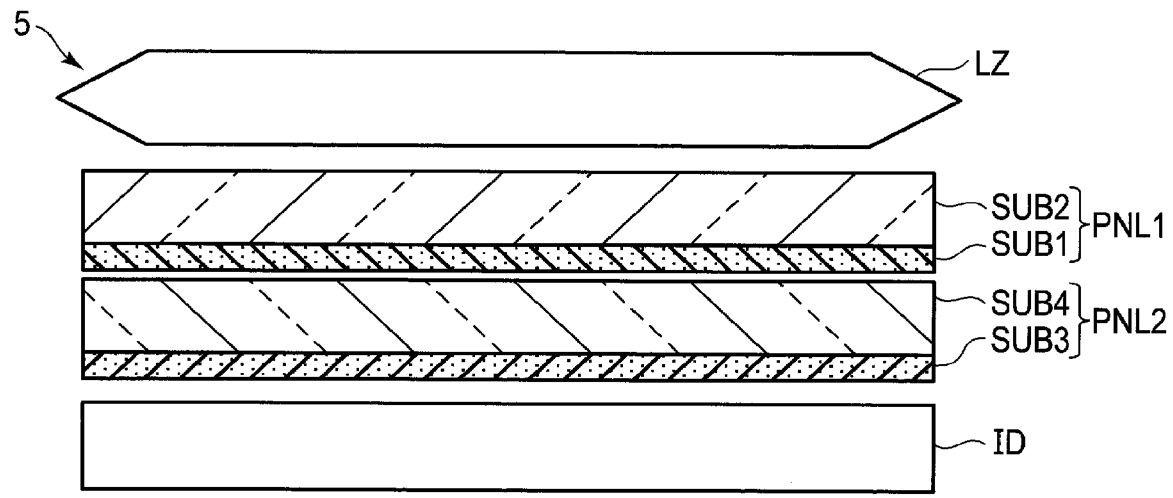
F I G. 9
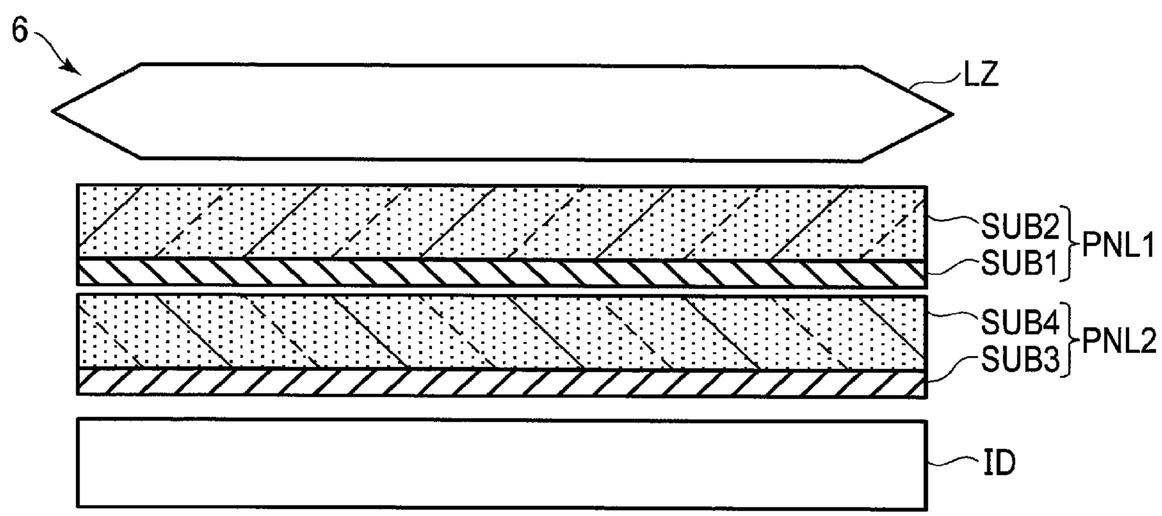
F I G. 10

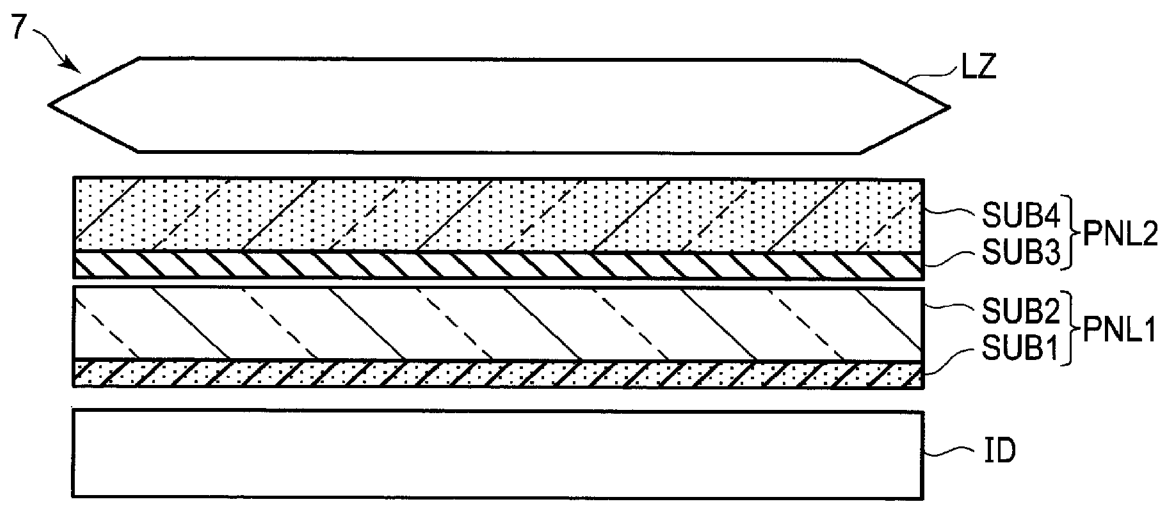
F I G. 11
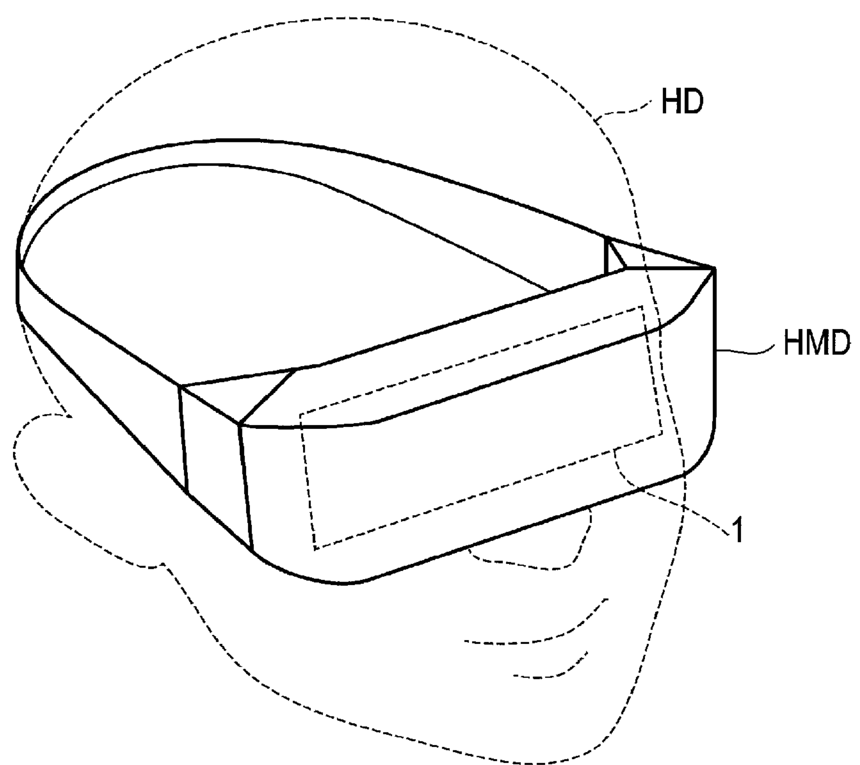
F I G. 13

| | | First embodiment | Second embodiment | Third embodiment | Fourth embodiment | Fifth embodiment | Sixth embodiment | Seventh embodiment |
|---|---|---|---|---|---|---|---|---|
| Reliability of high temperatures and humidity | | A | A | A | A | A | B | A |
| Resistance to heat (In process for manufacturing array substrate) | | C | B | A | C | C | A | B |
| Warp of substrates | | B | B | C | A | A | C | B |
| Overall assessment | | B | A | B | B | A | B | B |
| Display panel | Upper substrate | Counter-substrate (Rigid) | Counter-substrate (Rigid) | Array substrate (Rigid) | Counter-substrate (Rigid) | Counter-substrate (Rigid) | Array substrate (Rigid) | Array substrate (Rigid) |
| | Lower substrate | Array substrate (Flexible) | Array substrate (Flexible) | Counter-substrate (Flexible) | Array substrate (Flexible) | Array substrate (Flexible) | Counter-substrate (Flexible) | Counter-substrate (Flexible) |
| Dimming panel | Upper substrate | Counter-substrate (Flexible) | Counter-substrate (Flexible) | Counter-substrate (Flexible) | Array substrate (Flexible) | Counter-substrate (Rigid) | Array substrate (Rigid) | Counter-substrate (Rigid) |
| | Lower substrate | Array substrate (Rigid) | Array substrate (Rigid) | Array substrate (Rigid) | Counter-substrate (Rigid) | Array substrate (Flexible) | Counter-substrate (Flexible) | Array substrate (Flexible) |
| Panel order | Upper side | Display panel | Dimming panel | Display panel | Display panel | Dimming panel | Dimming panel | Display panel |
| | Lower side | Dimming panel | Display panel | Dimming panel | Dimming panel | Display panel | Display panel | Dimming panel |

FIG. 12

DISPLAY DEVICE

CROSS-REFERENCE TO RELATED APPLICATIONS

This application is based upon and claims the benefit of priority from Japanese Patent Application No. 2017-104391, filed May 26, 2017, the entire contents of which are incorporated herein by reference.

FIELD

Embodiments described herein relate generally to a display device.

BACKGROUND

A display device in which two panels are stacked is known. Each panel comprises an array substrate, a counter-substrate, and a liquid crystal layer sealed between these substrates. The contrast ratio of the display device is the integration of the contrast ratios of the two panels. Thus, the contrast ratio is improved in comparison with a common display device comprising only one panel.

While the contrast ratio is improved, the display device has various problems.

BRIEF DESCRIPTION OF THE DRAWINGS

FIG. 1 is an exploded perspective view schematically showing a structural example of a display device according to a first embodiment.

FIG. 2 shows schematic equivalent circuits of first and second pixels according to the first embodiment.

FIG. 3 is a schematic perspective view shown for explaining the image display by the display device according to the first embodiment.

FIG. 4 is a schematic cross-sectional view of the display device according to the first embodiment.

FIG. 5 shows a structural example of the display device according to the first embodiment.

FIG. 6 shows a structural example of a display device according to a second embodiment.

FIG. 7 shows a structural example of a display device according to a third embodiment.

FIG. 8 shows a structural example of a display device according to a fourth embodiment.

FIG. 9 shows a structural example of a display device according to a fifth embodiment.

FIG. 10 shows a structural example of a display device according to a sixth embodiment.

FIG. 11 shows a structural example of a display device according to a seventh embodiment.

FIG. 12 is a chart showing an example of effects obtained from the display device of each embodiment.

FIG. 13 schematically shows a head-mounted device into which a display device is incorporated.

DETAILED DESCRIPTION

In general, according to one embodiment, a display device comprises a dimming panel, a display panel and an illumination device. The dimming panel includes a first substrate, a second substrate facing the first substrate, and a first liquid crystal layer between the first substrate and the second substrate. The display panel includes a third substrate, a fourth substrate facing the third substrate, and a second liquid crystal layer between the third substrate and the fourth substrate. The illumination device irradiates the dimming panel or the display panel with light. In the display device, at least one of the first, second, third and fourth substrates is a rigid substrate, and at least one of the first, second, third and fourth substrates is a flexible substrate. With this structure, it is possible to improve the performance of a display device in which two panels each including a liquid crystal layer are stacked.

Some embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the drawings show schematic illustration rather than as an accurate representation of what is implemented. However, such schematic illustration is merely exemplary, and in no way restricts the interpretation of the invention. In the drawings, reference numbers of continuously arranged elements equivalent or similar to each other are omitted in some cases. In addition, in the specification and drawings, structural elements which function in the same or a similar manner to those described in connection with preceding drawings are denoted by like reference numbers, detailed description thereof being omitted unless necessary.

In this specification, the phrases "a includes A, B or C", "a includes one of A, B and C" and "a includes an element selected from a group consisting of A, B and C" do not exclude a case where a includes a plurality of combinations of A to C unless specified. Further, these phrases do not exclude a case where a includes other elements.

In this specification, the expressions "first" "second" and "third" of "the first member, the second member and the third member" are merely ordinal numbers used to explain the elements for the sake of convenience. Thus, the expression "A comprises the third member" includes a case where A does not comprise the first member and the second member unless otherwise specified.

In each embodiment, the two panels provided in the display device are assumed to be transmissive liquid crystal display panels. This display device may be used for various devices such as a smartphone, a tablet, a mobile phone, a personal computer, a television receiver, a vehicle-mounted device, a game console and a head-mounted device. Each embodiment does not prevent application of individual technical ideas disclosed in the embodiment to display devices comprising other types of display panels. Other types of display panels are assumed to include, for example, a reflective liquid crystal display panel which displays an image using external light, and a liquid crystal display panel having both a transmissive function and a reflective function.

First Embodiment

FIG. 1 is an exploded perspective view schematically showing a structural example of a display device 1. The display device 1 comprises an illumination device ID, a dimming panel PNL1 and a display panel PNL2. A first direction X, a second direction Y and a third direction Z are defined as shown in FIG. 1. The first, second and third directions X, Y and Z are orthogonal to one another in the present embodiment. However, they may intersect one another at an angle other than a right angle. In this disclosure, the third direction Z is referred to as "upward" or "toward the upper side". The opposite direction of the third direction Z is referred to as "downward" or "toward the lower side".

In the example of FIG. 1, the illumination device ID is a side-edge backlight comprising a light guide LG and a light source unit LU. However, the structure of the illumination device ID is not limited to the example of FIG. 1. Any structure may be employed as long as the illumination device ID emits light necessary for image display. For example, the illumination device ID may be a direct back-light including a light-emitting element provided under the dimming panel PNL1.

In the example of FIG. 1, the dimming panel PNL1, the display panel PNL2 and the light guide LG are formed in a rectangle comprising short sides parallel to the first direction X and long sides parallel to the second direction Y. The light guide LG, the dimming panel PNL1 and the display panel PNL2 are stacked in this order in the third direction Z. The shapes of the panels PNL1 and PNL2 and the light guide LG are not limited to a rectangle and may be other shapes.

The light guide LG comprises an incidence surface F1 and an emission surface F2. The incidence surface F1 is equivalent to one of the pair of side surfaces of the light guide LG in the first direction X. The emission surface F2 is equivalent to, of the pair of main surfaces of the light guide LG, the main surface on the dimming panel PNL1 side.

The light source unit LU comprises a plurality of light-emitting diodes LD arranged in the first direction X along the incidence surface F1 of the light guide LG. Instead of the light-emitting diodes LD, the light source unit LU may comprise other types of light-emitting elements such as an organic electroluminescent element. The light emitted from the light-emitting diodes LD enters the light guide LG through the incidence surface F1, passes through the light guide LG and is emitted from the emission surface F2.

The dimming panel PNL1 is a transmissive liquid crystal panel, and comprises a first substrate SUB1, a second substrate SUB2 facing the first substrate SUB1, and a first liquid crystal layer LC1 provided between the substrate SUB1 and the substrate SUB2. The dimming panel PNL1 comprises a dimming area A1 including a plurality of first pixels PX1. The first pixels PX1 are arrayed in matrix in the first direction X and the second direction Y.

The display panel PNL2 is a transmissive liquid crystal panel, and comprises a third substrate SUB3 facing the second substrate SUB2, a fourth substrate SUB4 facing the third substrate SUB3, and a second liquid crystal layer LC2 sealed between the substrate SUB3 and the substrate SUB4. The display panel PNL2 comprises a display area A2 including a plurality of second pixels PX2. The second pixels PX2 are arrayed in matrix in the first direction X and the second direction Y.

The illumination device ID emits light in the third direction Z. In the example of FIG. 1, in the direction of irradiation of this light, the first substrate SUB1, the second substrate SUB2, the third substrate SUB3 and the fourth substrate SUB4 are arranged in order.

The display device 1 further comprises a reflective sheet RF, optical sheets OG, a first polarizing member PL1, a second polarizing member PL2 and a third polarizing member PL3.

The reflective sheet RF faces the rear surface of the main surfaces of the light guide LG, in other words, the surface opposite to the emission surface F2. The reflective sheet RF returns the light leaking from the rear surface to the light guide LG. A reflective sheet facing the side surfaces of the light guide LG excluding the incidence surface F1 may be further provided.

The optical sheets OG includes, for example, a diffusion sheet DF which diffuses the light emitted from the emission surface F2 of the light guide LG, and first and second prism sheets PR1 and PR2 in which a number of prism lenses are formed.

The first polarizing member PL1 is provided between the light guide LG and the first substrate SUB1. The second polarizing member PL2 is provided between the second substrate SUB2 and the third substrate SUB3. The third polarizing member PL3 is provided on the display panel PNL2 and faces the fourth substrate SUB4.

The first polarizing member PL1 and the third polarizing member PL3 comprise a first polarizing axis. The second polarizing member PL2 comprises a second polarizing axis orthogonal to the first polarizing axis. A crossed-Nicol relationship is established between the first polarizing member PL1 and the second polarizing member PL2 and between the second polarizing member PL2 and the third polarizing member PL3.

In the display device 1 comprising the above structure, the light emitted from the emission surface F2 of the light guide LG passes through the first polarizing member PL1 and enters the dimming panel PNL1. The light entering the dimming panel PNL1 is linearly polarized light orthogonal to the first polarizing axis of the first polarizing member PL1. There is little change in the state of polarization of this light when the light passes an area corresponding to a first pixel PX1 in an off state (black display) in the first liquid crystal layer LC1. The light is absorbed by the second polarizing member PL2 comprising the second polarizing axis orthogonal to the first polarizing axis.

The state of polarization of the light entering the dimming panel PNL1 is changed when the light passes an area corresponding to a first pixel PX1 in an on state (white display) in the first liquid crystal layer LC1. The polarization of at least part of the light is orthogonal to the second polarizing axis of the second polarizing member PL2. Thus, at least part of the light passes through the second polarizing member PL2.

The light having passed through the second polarizing member PL2 enters the display panel PNL2. The light entering the display panel PNL2 is linearly polarized light orthogonal to the second polarizing axis of the second polarizing member PL2. There is little change in the state of polarization of this light when the light passes an area corresponding to a second pixel PX2 in an off state in the second liquid crystal layer LC2. The light is absorbed by the third polarizing member PL3 comprising the first polarizing axis.

The state of polarization of the light entering the display panel PNL2 is changed when the light passes an area corresponding to a second pixel PX2 in an on state in the second liquid crystal layer LC2. The polarization of at least part of the light is orthogonal to the first polarizing axis. Thus, at least part of the light passes through the third polarizing member PL3 and forms an image.

The present embodiment assumes that a normally-black mode is applied to the panels PNL1 and PNL2. However, a normally-white mode may be applied to the panels PNL1 and PNL2.

FIG. 2 shows schematic equivalent circuits of the first and second pixels PX1 and PX2.

As shown in FIG. 2(A), the dimming panel PNL1 comprises a plurality of scanning lines G1 extending in the first direction X, and a plurality of signal lines S1 extending in the second direction Y. The areas defined by the scanning lines G1 and the signal lines S1 are equivalent to the first pixels PX1. Each first pixel PX1 comprises a first switching element SW1, a first pixel electrode PE1 and a first common electrode CE1. The first switching element SW1 is electrically connected to the scanning line G1, the signal line S1 and the first pixel electrode PE1. When a scanning signal is supplied to the scanning line G1, the video signal of the signal line S1 is supplied to the first pixel electrode PE1. At this time, the electric field formed between the first pixel electrode PE1 and the first common electrode CE1 affects the first liquid crystal layer LC1 (on state). In the present embodiment, the first substrate SUB1 does not comprise a color filter layer. Thus, the first pixels PX1 are monochromatic pixels displaying white or black.

As shown in FIG. 2(B), the display panel PNL2 comprises a plurality of scanning lines G2 extending in the first direction X, and a plurality of signal lines S2 extending in the second direction Y. The areas defined by the scanning lines G2 and the signal lines S2 are equivalent to subpixels SP. The fourth substrate SUB4 comprises a color filter layer 42 (see FIG. 4) including color filters corresponding to a plurality of colors. Thus, each subpixel SP displays a color based on a corresponding color filter. Each second pixel PX2 includes, for example, subpixels SPR, SPG and SPB displaying red, green and blue, respectively. The subpixels SPR, SPG and SPB are arranged in, for example, the first direction X. The types of the subpixels SP included in each second pixel PX2 are not limited to this example. For example, each second pixel PX2 may further include a subpixel SP displaying another color such as white.

Each subpixel SP comprises a second switching element SW2, a second pixel electrode PE2 and a second common electrode CE2. The second switching element SW2 is electrically connected to the scanning line G2, the signal line S2 and the second pixel electrode PE2. When a scanning signal is supplied to the scanning line G2, the video signal of the signal line S2 is supplied to the second pixel electrode PE2. At this time, the electric field formed between the second pixel electrode PE2 and the second common electrode CE2 affects the second liquid crystal layer LC2 (on state).

FIG. 3 is a schematic perspective view shown for explaining the image display by the display device 1. FIG. 3 shows only some of the elements constituting the display device 1.

The display device 1 comprises a controller CT. The controller CT controls the light source unit LU, the dimming panel PNL1 and the display panel PNL2. For example, the controller CT is structured by an IC and various circuits. The controller CT turns on or off each first pixel PX1 of the dimming panel PNL1 and each second pixel PX2 (subpixel SP) of the display panel PNL2 in accordance with, for example, the image data input from outside.

For example, as shown in FIG. 3, this specification assumes that an image including a high-brightness portion HB and a low-brightness portion LB is displayed in the display area A2. In this case, in the dimming area A1, the controller CT turns on first pixels PX1 corresponding to the high-brightness portion HB, and turns off first pixels PX1 corresponding to the low-brightness portion LB. Further, in the display area A2, the controller CT turns on second pixels PX2 corresponding to the high-brightness portion HB, and turns off second pixels PX2 corresponding to the low-brightness portion LB.

The light emitted from the illumination device ID passes through portions corresponding to the first pixels PX1 which are turned on in the dimming area A1, and hardly passes through portions corresponding to the first pixels PX1 which are turned off in the dimming area A1. The light having passed through the dimming area A1 passes through the high-brightness portion HB of the display area A2, and forms an image viewed by the user.

In a common liquid crystal panel, even when pixels are turned off, it is difficult to completely block the light emitted from the backlight. Light slightly leaks out. As a result, it is difficult to adequately enhance the contrast ratio between the pixels which are turned on and the pixels which are turned off. In the structure of the present embodiment, two panels block light in the low-brightness portion LB. Thus, it is possible to sufficiently decrease the brightness of the low-brightness portion LB and enhance the contrast ratio of the display device 1.

FIG. 4 is a schematic cross-sectional view of the display device 1. In FIG. 4, the illustrations of the illumination device ID, the scanning lines G1 and G2, the signal lines S1 and S2, the switching elements SW1 and SW2, etc., are omitted.

The first substrate SUB1 of the dimming panel PNL1 comprises a first base 10, an insulating layer 11, an alignment film 12 and the first pixel electrodes PE1. The insulating layer 11 covers the upper surface of the first base 10. FIG. 4 shows the insulating layer 11 as a single layer. However, in the actual device, the insulating layer 11 includes a plurality of layers such as an organic resinous film and an inorganic resinous film. The first pixel electrodes PE1 are provided on the insulating layer 11. The alignment film 12 covers the first pixel electrodes PE1 and the insulating layer 11.

The second substrate SUB2 of the dimming panel PNL1 comprises a second base 20, a light-shielding layer 21, an overcoat layer 22, an alignment film 23 and the first common electrode CE1. The light-shielding layer 21 is provided under the second base 20. The light-shielding layer 21 faces, for example, the above scanning lines G1 and signal lines S1 in the third direction Z. The overcoat layer 22 is, for example, an organic resinous film, and covers the lower surface of the second base 20 and the light-shielding layer 21. The first common electrode CE1 is provided under the overcoat layer 22. The alignment film 23 covers the first common electrode CE1. The first liquid crystal layer LC1 is provided between the alignment film 12 and the alignment film 23.

The third substrate SUB3 of the display panel PNL2 comprises a third base 30, insulating layers 31 and 32, an alignment film 33, the second pixel electrodes PE2 and the second common electrode CE2. The insulating layer 31 covers the upper surface of the third base 30. FIG. 4 shows the insulating layer 31 as a single layer. However, in the actual device, the insulating layer 31 includes a plurality of layers such as an organic resinous film and an inorganic resinous film. The second common electrode CE2 is provided on the insulating layer 31. The insulating layer 32 is, for example, an inorganic resinous film, and covers the second common electrode CE2. The second pixel electrodes PE2 are provided on the insulating layer 32. In the example of FIG. 4, the second pixel electrodes PE2 comprise a plurality of slits. However, the second pixel electrodes PE2 may not comprise a slit. The alignment film 33 covers the second pixel electrodes PE2 and the insulating layer 32.

The fourth substrate SUB4 of the display panel PNL2 comprises a fourth base 40, a light-shielding layer 41, the color filter layer 42, an overcoat layer 43 and an alignment film 44. The light-shielding layer 41 is provided under the fourth base 40. The light-shielding layer 41 faces the above scanning lines G2 and signal lines S2 in the third direction Z. The light-shielding layer 41 faces the light-shielding layer 21 in the third direction Z. The color filter layer 42 covers the lower surface of the fourth base 40 and the light-shielding layer 41. The overcoat layer 43 is, for example, an organic resinous film, and covers the color filter layer 42. The color filter layer 42 is, for example, an organic resinous film, and includes color filters corresponding to colors corresponding to the subpixels SPR, SPG and SPB. The color filter layer 42 may be provided in the third substrate SUB3. The alignment film 44 covers the overcoat layer 43. The second liquid crystal layer LC2 is provided between the alignment film 33 and the alignment film 44.

The pixel electrodes PE1 and PE2 and the common electrodes CE1 and CE2 are formed of a transparent conductive material such as indium tin oxide (ITO).

The structure of the dimming panel PNL1 shown in FIG. 4 is equivalent to a vertical aligned (VA) mode. In an off state, homeotropic alignment (vertical alignment) is applied to the liquid crystal molecules of the first liquid crystal layer LC1 in the third direction Z. In an on state, the liquid crystal molecules of the first liquid crystal layer LC1 are aligned in a direction intersecting the third direction Z by the vertical electric field (in the third direction Z) generated between the first pixel electrodes PE1 and the first common electrode CE1 provided in the different substrates SUB1 and SUB2. The structure of the display panel PNL2 shown in FIG. 4 is equivalent to a fringe field switching (FFS) mode, which is a type of in-plane switching (IPS) mode. In an off state, the liquid crystal molecules of the second liquid crystal layer LC2 are aligned in the alignment treatment direction of the alignment films 33 and 44. In an on state, the liquid crystal molecules of the second liquid crystal layer LC2 are aligned mainly by the lateral electric field (in a direction parallel to the X-Y plane) generated between the second pixel electrodes PE2 and the second common electrode CE2 provided in a single substrate SUB3. The mode of the panel PNL1 or PNL2 is not limited to these examples. Various modes can be applied.

In the dimming panel PNL1, the areas defined by the light-shielding layer 21 are equivalent to the first pixels PX1. In the display panel PNL2, the areas defined by the light-shielding layer 41 are equivalent to the subpixels SP. In the example of FIG. 4, the second pixel PX2 includes the subpixels SPR, SPG and SPB arranged in the first direction X. For example, the subpixels SP face the first pixels PX1 in the third direction Z. Further, the size of each subpixel SP is equal to that of each first pixel PX1. However, each first pixel PX1 may be larger than a plurality of subpixels SP. In this case, each first pixel PX1 faces a plurality of subpixels SP.

The display device 1 further comprises a first adhesive layer AD1, a second adhesive layer AD2, a third adhesive layer AD3 and a fourth adhesive layer AD4. For example, the polarizing members PL1 to PL3 are polarizing plates which are attached to the panels PNL1 and PNL2 after the polarizing members PL1 to PL3 are manufactured separately from the panels PNL1 and PNL2. The first polarizing member PL1 is attached to the lower surface of the first base 10 via the first adhesive layer AD1. The second polarizing member PL2 is attached to the upper surface of the second base 20 via the second adhesive layer AD2, and is attached to the lower surface of the third base 30 via the third adhesive layer AD3. The third polarizing member PL3 is attached to the upper surface of the fourth base 40 via the fourth adhesive layer AD4. For example, the polarizing members PL1 to PL3 are iodine-type polarizing plates, and comprise a structure in which a polarizing layer formed of polyvinyl alcohol (PVA) containing aligned iodine is interposed between a pair of support films formed of triacetyl cellulose (TAC). However, the structures of the polarizing members PL1 to PL3 are not limited to this example.

At least one of the polarizing members PL1 to PL3 may be a polarizing film. The polarizing film may be referred to as a coatable polarizer. For example, a polarizing plate may be used for the first polarizing member PL1 and the third polarizing member PL3, and a polarizing film may be used for the second polarizing member PL2. To form the second polarizing member PL2, a material of an alignment film is applied to the second base 20. The second base 20 is subjected to provisional burning, and is irradiated with linearly polarized ultraviolet light. Subsequently, burning is applied again. A liquid crystal material containing dye is applied to the material of an alignment film. The material is subjected to provisional burning, and is irradiated with ultraviolet light. Subsequently, burning is applied again. In this way, the dye of the liquid crystal material is aligned in a predetermined direction. It is possible to obtain the second polarizing member PL2 as a polarizing film which functions as a linear polarizing element. The second polarizing member PL2 explained here is merely an example. A polarizing film comprising any structure may be used as long as it functions as a linear polarizing element. Further, the manufacturing process is not particularly limited. The second polarizing member PL2 which is a polarizing film may be formed inside the second substrate SUB2 or the third substrate SUB3.

The scanning lines G1, the signal lines S1 and the first switching elements SW1 shown in FIG. 2 are provided in the first substrate SUB1. The first substrate SUB1 is the array substrate of the dimming panel PNL1. The second substrate SUB2 is the counter-substrate of the dimming panel PNL1. The scanning lines G2, the signal lines S2 and the second switching elements SW2 shown in FIG. 2 are provided in the third substrate SUB3. The third substrate SUB3 is the array substrate of the display panel PNL2, and the fourth substrate SUB4 is the counter-substrate of the display panel PNL2.

In the present embodiment, the first and fourth bases 10 and 40 are formed of, for example, glass, and have rigidity. Thus, the first and fourth substrates SUB1 and SUB4 are rigid substrates. The second and third bases 20 and 30 are formed of a resinous material such as polyimide, polyester or polycarbonate, and have flexibility. Thus, the second and third substrates SUB2 and SUB3 are flexible substrates. In the example of FIG. 4, the second and third bases 20 and 30 are thinner than the first and fourth bases 10 and 40. In this way, resinous bases can be formed so as to be thinner than glass bases. Further, the weight of resinous bases is less than that of glass bases.

Polyimide has a negative-C phase difference. Homeotropic alignment is applied to the liquid crystal molecules of the liquid crystal layer in a VA mode as described above. The liquid crystal molecules are aligned such that the long axis is parallel to the third direction Z. The liquid crystal molecules have a positive-C phase difference. When a VA mode is applied to the dimming panel PNL1 like the present embodiment, the first liquid crystal layer LC1 has a positive-C phase difference. Thus, it is possible to negate the negative-C phase difference generated when the second and third bases 20 and 30 are formed of polyimide.

The use application of the display device 1 in which the contrast ratio is enhanced like the present embodiment is not particularly limited. For example, the display device 1 may be used as a display device for virtual reality (VR), augmented reality (AR) or mixed reality (MR) requiring a high contrast ratio. In this case, as shown in FIG. 13, the display device 1 may be incorporated into a head-mounted device HMD mounted on the head HD of the user.

FIG. 5 shows a structural example of the display device 1 used for VR, etc. The display device 1 comprises a lens LZ facing the fourth substrate SUB4 in addition to the illumination device ID, the dimming panel PNL1 and the display panel PNL2. The lens LZ enlarges the image displayed by the display panel PNL2 such that the size is most suitable for the point of view of the user. For example, the contrast ratio of the display device 1 is greater than or equal to 5000 (preferably, greater than or equal to 10000). When the display device 1 has such a high contrast ratio, the user can view an excellent image.

In the present embodiment, the second and third substrates SUB2 and SUB3 are flexible substrates. However, when at least one of the substrates SUB1 to SUB4 is a flexible substrate, and the others are rigid substrates, the weight of the display device can be reduced.

Various display devices are disclosed as second to seventh embodiments below. After these embodiments are explained, the effects obtained from the first to seventh embodiments are described. FIG. 6 to FIG. 11 which are referred to in the embodiments show display devices comprising the lens LZ in a manner similar to that of FIG. 5. However, the use application of the display device of each embodiment is not particularly limited. The display devices may not comprise the lens LZ. In FIG. 6 to FIG. 11, a dotted pattern is applied to the array substrates of the dimming panel PNL1 and the display panel PNL2. This pattern is not applied to the counter-substrates. Further, oblique solid lines and broken lines are alternately added to rigid substrates. Oblique solid lines are added to flexible substrates. The same illustration method is used for the above FIG. 5.

Second Embodiment

FIG. 6 shows a structural example of a display device 2 according to a second embodiment. In the display device 2, a display panel PNL2 is provided between an illumination device ID and a dimming panel PNL1. In the direction in which the illumination device ID emits light, a third substrate SUB3, a fourth substrate SUB4, a first substrate SUB1 and a second substrate SUB2 are arranged in order. Even in this structure, the contrast ratio can be enhanced in a manner similar to that of the first embodiment.

The first and third substrates SUB1 and SUB3 are array substrates. The second and fourth substrates SUB2 and SUB4 are counter-substrates. The first and fourth substrates SUB1 and SUB4 are flexible substrates. The second and third substrates SUB2 and SUB3 are rigid substrates.

Third Embodiment

FIG. 7 shows a structural example of a display device 3 according to a third embodiment. In the display device 3, an illumination device ID, a dimming panel PNL1 and a display panel PNL2 are provided in a manner similar to that of the first embodiment.

First and fourth substrates SUB1 and SUB4 are array substrates. Second and third substrates SUB2 and SUB3 are counter-substrates. The first and fourth substrates SUB1 and SUB4 are rigid substrates. The second and third substrates SUB2 and SUB3 are flexible substrates.

Fourth Embodiment

FIG. 8 shows a structural example of a display device 4 according to a fourth embodiment. In the display device 4, an illumination device ID, a dimming panel PNL1 and a display panel PNL2 are provided in a manner similar to that of the first embodiment.

Second and third substrates SUB2 and SUB3 are array substrates. First and fourth substrates SUB1 and SUB4 are counter-substrates. The first and fourth substrates SUB1 and SUB4 are rigid substrates. The second and third substrates SUB2 and SUB3 are flexible substrates.

Fifth Embodiment

FIG. 9 shows a structural example of a display device 5 according to a fifth embodiment. In the display device 5, an illumination device ID, a dimming panel PNL1 and a display panel PNL2 are provided in a manner similar to that of the second embodiment.

First and third substrates SUB1 and SUB3 are array substrates. Second and fourth substrates SUB2 and SUB4 are counter-substrates. The second and fourth substrates SUB2 and SUB4 are rigid substrates. The first and third substrates SUB1 and SUB3 are flexible substrates.

Sixth Embodiment

FIG. 10 shows a structural example of a display device 6 according to a sixth embodiment. In the display device 6, an illumination device ID, a dimming panel PNL1 and a display panel PNL2 are provided in a manner similar to that of the second embodiment.

Second and fourth substrates SUB2 and SUB4 are array substrates. First and third substrates SUB1 and SUB3 are counter-substrates. The second and fourth substrates SUB2 and SUB4 are rigid substrates. The first and third substrates SUB1 and SUB3 are flexible substrates.

Seventh Embodiment

FIG. 11 shows a structural example of a display device 7 according to a seventh embodiment. In the display device 7, an illumination device ID, a dimming panel PNL1 and a display panel PNL2 are provided in a manner similar to that of the first embodiment.

First and fourth substrates SUB1 and SUB4 are array substrates. Second and third substrates SUB2 and SUB3 are counter-substrates. The second and fourth substrates SUB2 and SUB4 are rigid substrates. The first and third substrates SUB1 and SUB3 are flexible substrates.

Effects of Embodiments

According to each of the display devices 1 to 7 of the embodiments, the contrast ratio can be improved by stacking two panels. When the substrates SUB1 to SUB4 are rigid substrates, the weight and thickness of each display device are increased. However, in the display devices 1 to 7 of the embodiments, two of the substrates SUB1 to SUB4 are flexible substrates. Thus, the weight and thickness can be reduced. Only with regard to the reduction in weight and thickness, all the substrates SUB1 to SUB4 should be preferably flexible substrates. However, in this case, problems may occur in terms of the reliability of high temperatures and humidity, the resistance to heat in a process for manufacturing an array substrate, and the warp of substrates. Now, this specification explains the details of these problems and the effects of the display devices 1 to 7 of the embodiments.

FIG. 12 is a chart showing an example of effects obtained from the display devices 1 to 7. Here, the display devices 1 to 7 are evaluated with respect to three items, specifically, the reliability of high temperatures and humidity, the resistance to heat (in a process for manufacturing an array substrate) and the warp of substrates. The lower part of the chart shows the schematic structures of the display devices 1 to 7 of the embodiments. The upper substrates of the display panel and the dimming panel are the substrates on the lens LZ side. The lower substrates are the substrates on the illumination device ID side. The upper side of the panel order is the panel provided on the lens LZ side. The lower side is the panel provided on the illumination device ID side.

The above evaluation items are explained below. Each embodiment is evaluated with respect to each item with three ranks, specifically, A (excellent), B (good) and C (fair).

(1) Reliability of High Temperatures and Humidity

At high temperatures and humidity, the reliability of each display device may be reduced as the elements included in the dimming panel PNL1 and the display panel PNL2 are detrimentally affected. When the substrate (uppermost substrate) closest to the lens LZ and the substrate (lowermost substrate) closest to the illumination device ID are rigid substrates using glass bases, etc., the internal side of the panels PNI1 and PNL2 is less affected even at high temperatures or high humidity in comparison with a case where the substrates are flexible substrates using resinous bases. Each array substrate includes an inorganic resinous film in which the resistance to humidity is higher than that of an organic resinous film. Therefore, even in a case where the uppermost or lowermost substrate is a resinous substrate, when the substrate is an array substrate, the resistance to humidity is improved. The environment at high temperatures and humidity affects the structure easily from the uppermost substrate side which is the display surface. In this respect, the standards of ranks A, B and C are set in the following manner.

[A]: Both the uppermost substrate and the lowermost substrate are rigid substrates or array substrates.

[B]: The lowermost substrate is not a rigid substrate or an array substrate. The uppermost substrate is a rigid substrate or an array substrate.

[C]: The uppermost substrate is not a rigid substrate or an array substrate.

(2) Resistance to Heat (In Process for Manufacturing Array Substrate)

In a process for manufacturing an array substrate, for example, when the semiconductor layer of the switching elements SW1 and SW2 is formed, a step at high temperatures is needed. When the array substrate is a flexible substrate, the resinous base may be deformed or deteriorated in the step at high temperatures. To realize a high resolution of pixels and excellent display quality, small thin-film transistors with high performance should be preferably used for the display panel PNL2. For example, one of such thin-film transistors is an LTPS thin-film transistor using polysilicon formed at low temperatures. However, in this type of thin-film transistor, when polysilicon is formed, the temperature is high at several hundred degrees. Thus, the resinous base may be affected. The resolution of pixels of the dimming panel PNL1 may be lower than that of the display panel PNL2. Thus, the thin-film transistor used for each first switching element SW1 can be selected in a wide range. For example, for each first switching element SW1, a thin-film transistor using an amorphous silicon semiconductor or a TAOS thin-film transistor using a transparent amorphous oxide semiconductor can be employed. The performance of TAOS thin-film transistors is lower than that of LTPS thin-film transistors. However, in a TAOS thin-film transistor, a semiconductor layer can be formed at extremely low temperatures. Thus, the resinous base is less affected. In this respect, the standards of ranks A, B and C are set in the following manner.

[A]: Both of the array substrates of the dimming panel and the display panel are rigid substrates.

[B]: The array substrate of the dimming panel is not a flexible substrate. The array substrate of the display panel is a rigid substrate.

[C]: The array substrate of the display panel is a flexible substrate.

(3) Warp of Substrates

In a process for manufacturing a flexible substrate, a resinous base is formed on a glass substrate. Each layer is formed on the resinous base. The resinous base is removed from the glass substrate. After the removal, the flexible substrate may warp because of the contraction of the resinous base. Since each array substrate comprises an inorganic resinous film, the above warp hardly occurs. However, a counter-substrate comprising a common structure does not comprise an inorganic resinous film. Thus, a warp easily occurs. When a counter-substrate is a flexible substrate, an inorganic resinous film may be added to the counter-substrate. However, in this case, the number of manufacturing processes is increased, and the thickness of the counter-substrate is increased. In this respect, the standards of ranks A, B and C are set in the following manner.

[A]: Both of the counter-substrates of the dimming panel and the display panel are rigid substrates.

[B]: One of the counter-substrates of the dimming panel and the display panel is a rigid substrate. The other one is a flexible substrate.

[C]: Both of the counter-substrates of the dimming panel and the display panel are flexible substrates.

(4) Overall Assessment

The chart of FIG. 12 shows the results of overall assessment of the display devices 1 to 7 of the embodiments based on the results of evaluation of the three items regarding the reliability of high temperatures and humidity, the resistance to heat (in a process for manufacturing an array substrate) and the warp of substrates. The display device 1 of the first embodiment is excellent or good in the reliability of high temperatures and humidity and the warp of substrates. However, the resistance to heat is evaluated as C. Thus, the overall assessment is B. Each item of the display device 2 of the second embodiment is evaluated as A or B. As the display device 2 has excellent performance, the overall assessment is A. In the display device 5 of the fifth embodiment, two items are evaluated as A. As the display device 5 has excellent performance, the overall assessment is A. The display device 6 of the sixth embodiment is excellent or good in the reliability of high temperatures and humidity and the resistance to heat. However, the warp of substrates is evaluated as C. Thus, the overall assessment is B. In the display devices 3, 4 and 7 of the third, fourth and seventh embodiments, one or two items are evaluated as A. However, in the display devices 3, 4 and 7, the array substrate of the dimming panel PNL1 or the display panel PNL2 is located at the uppermost position. Therefore, a light-shielding layer for shielding each metal line of the array substrate from light needs to be separately provided. In this respect, the overall assessment of the display devices 3, 4 and 7 of the third, fourth and seventh embodiments is B.

To determine the performance of the display devices, various items are present other than the above three items.

A desirable embodiment differs depending on the item to be particularly considered. Thus, an optimal structure should be selected from the structures of the display devices 1 to 7 of the embodiments based on the required performance.

In the display device of each embodiment, two of the four substrates SUB1 to SUB4 are rigid substrates, and the other two are flexible substrates. However, one or three of the four substrates SUB1 to SUB4 may be a rigid substrate (rigid substrates), and the remaining substrates or substrate may be flexible substrates (a flexible substrate). Even in this case, the weight and thickness of the display devices can be reduced in comparison with a case where all the substrates SUB1 to SUB4 are rigid substrates. Further, it is possible to realize a display device having an excellent evaluation in the above evaluation standards by appropriately selecting the substrate to be used as a rigid substrate or a flexible substrate.

In the above embodiments, a VA mode is applied to the dimming panel, and an IPS mode is applied to the display panel. However, various modes can be applied to the dimming panel and the display panel, such as a twisted nematic (TN) mode, a polymer dispersed liquid crystal (PDLC) mode, an optically compensated bend (OCB) mode and an electrically controlled birefringence (ECB) mode. When a TN mode is applied to the dimming panel and the display panel, the characteristics of viewing angle can be improved by shifting the alignment treatment directions of the dimming panel PNL1 and the display panel PNL2 at 90 degrees. For example, the alignment treatment directions of the two alignment films of the dimming panel PNL1 may be set to directions at 45 degrees and 135 degrees with respect to the first direction X, and the alignment treatment directions of the two alignment films of the display panel PNL2 may be set to directions at 135 degrees and 225 degrees with respect to the first direction X. Rubbing treatment or optical alignment treatment may be used for the alignment treatment.

The type of the dimming panel PNL1 is not limited to an active-matrix type, and may be a passive-matrix type.

All of the display devices which may be realized by a person of ordinary skill in the art by appropriately changing the design based on the display device explained as each embodiment of the present invention fall within the scope of the invention as long as they encompass the spirit of the invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from the embodiments and are self-explanatory from the descriptions of the specification or can be arbitrarily conceived by a person of ordinary skill in the art are considered as the effects of the present invention as a matter of course.

What is claimed is:

1. A display device comprising:

a dimming panel including a first substrate, a second substrate facing the first substrate, and a first liquid crystal layer between the first substrate and the second substrate;

a display panel including a third substrate, a fourth substrate facing the third substrate, and a second liquid crystal layer between the third substrate and the fourth substrate; and an illumination device which irradiates the dimming panel or the display panel with light, wherein the second substrate, the first substrate, the third substrate, and the fourth substrate are arranged in order, the first substrate and the third substrate are array substrates each including an inorganic film and a plurality of pixel electrodes, the second substrate and the fourth substrate are counter substrates, the second substrate and the fourth substrate are rigid substrates, the first substrate and the third substrate are flexible substrates, the first substrate is thinner than the second substrate, the third substrate is thinner than the fourth substrate, a first polarizing member is attached to the second substrate, a third polarizing member is attached to the fourth substrate, and a second polarizing member is attached to the first substrate and the third substrate.

2. The display device of claim 1, wherein the first substrate comprises a plurality of switching elements each having an oxide semiconductor.

3. The display device of claim 1, wherein the third substrate comprises a plurality of switching elements each having an oxide semiconductor.

4. The display device of claim 1, wherein homeotropic alignment is applied to liquid crystal molecules of the first liquid crystal layer in the dimming panel.

5. The display device of claim 4, wherein the first liquid crystal layer has a positive-C phase difference, and a base of the flexible substrate has a negative-C phase difference.

6. The display device of claim 1, wherein in the dimming panel, a pixel electrode is provided in one of the first and second substrates, and a common electrode is provided in the other one of the first and second substrates, and in the display panel, both a pixel electrode and a common electrode are provided in one of the third and fourth substrates.

7. The display device of claim 1, wherein the display panel comprises a color filter layer including color filters corresponding to a plurality of colors, respectively, and the dimming panel does not comprise a color filter layer.

8. The display device of claim 1, further comprising an illumination device which irradiates the display panel with light, wherein the display panel is located between the dimming panel and the illumination device.

9. The display device of claim 1, wherein the display panel and the dimming panel are in-plane switching mode LCD panels.

* * * * *